United States Patent
Gamet et al.

(10) Patent No.: US 9,467,034 B2
(45) Date of Patent: Oct. 11, 2016

(54) ELECTROMAGNETIC ACTUATOR FOR OPTICAL DEVICE TO REDUCE TEMPERATURE AND DEFORMATION

(71) Applicant: Intel Corporation, Santa Clara, CA (US)

(72) Inventors: Julien Gamet, Saint Pierre d'Allevard (FR); Faouzi Khechana, Preverengers (CH)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/353,746

(22) PCT Filed: Sep. 25, 2012

(86) PCT No.: PCT/EP2012/068822
§ 371 (c)(1),
(2) Date: Apr. 23, 2014

(87) PCT Pub. No.: WO2013/060540
PCT Pub. Date: May 2, 2013

(65) Prior Publication Data
US 2014/0354085 A1    Dec. 4, 2014

Related U.S. Application Data

(60) Provisional application No. 61/551,018, filed on Oct. 25, 2011.

(51) Int. Cl.
*H02K 33/00*    (2006.01)
*H02K 33/16*    (2006.01)
(Continued)

(52) U.S. Cl.
CPC ............. *H02K 33/00* (2013.01); *B81B 3/0072* (2013.01); *G02B 26/08* (2013.01); *G02B 26/085* (2013.01); *H02K 33/02* (2013.01); *H02K 33/16* (2013.01); *B81B 2201/038* (2013.01); *B81B 2201/042* (2013.01); *B81B 2203/058* (2013.01); *H02K 9/22* (2013.01)

(58) Field of Classification Search
CPC ...... H02K 33/16; H02K 33/00; H02K 33/02; G02B 7/182; G02B 7/1821; G02B 7/198; G02B 7/002; G02B 26/101; G02B 26/085; G02B 26/10; G02B 26/08; G02B 26/0825; G02B 26/0833; B81B 3/0072; B81B 2203/058; B81B 2201/042; B81B 2201/038
USPC ........ 310/36; 257/415; 359/224.1, 198, 230, 359/224.2, 200.7; 335/222
See application file for complete search history.

(56) References Cited

U.S. PATENT DOCUMENTS 4,421,381 A * 12/1983 Ueda et al. ................. 359/214.1
5,912,608 A *  6/1999 Asada .......................... 335/222
(Continued)

FOREIGN PATENT DOCUMENTS

EP    0836265 A1    4/1998
EP    1255150 A1    11/2002
(Continued)

OTHER PUBLICATIONS

Office Action received for Japanese Patent Application No. 2012-004338, mailed Sep. 8, 2015, 6 pages including 3 pages English translation.

*Primary Examiner* — Terrance Kenerly
*Assistant Examiner* — Alexander Singh

(57) ABSTRACT

According to the present invention there is provided an actuator comprising, a movable member, the movable member comprising a support frame which is configured such that it can oscillate about a first oscillation axis and a mirror which is fixed to the support frame such that oscillation of the support frame will effect oscillation of the mirror; an coil, which cooperates with the support frame; one or more boundary portions provided between the support frame and the mirror which reduce the influence of warp transmitted from an edge of the support frame to the mirror, as the support frame oscillates about the first oscillation axis; wherein the support frame further comprises one or more cut-out regions, wherein the one or more cut-out regions are configured to be parallel to at least a portion of the coil, to reduce stress on the coil as the support frame oscillates about the first oscillation axis and/or to reduce the temperature dependence of the properties of the actuator.

13 Claims, 10 Drawing Sheets

(51) Int. Cl.
  *H02K 33/02* (2006.01)
  *G02B 26/08* (2006.01)
  *B81B 3/00* (2006.01)
  *H02K 9/22* (2006.01)

(56) References Cited

U.S. PATENT DOCUMENTS 6,774,445 B2 * 8/2004 Mutoh et al. ............... 257/415

2008/0018974 A1 * 1/2008 Cho .................... G02B 26/085
                                                        359/224.1
2008/0100898 A1 * 5/2008 Kang et al. .................. 359/224
2008/0238592 A1 * 10/2008 Ko et al. ....................... 335/222

FOREIGN PATENT DOCUMENTS

| EP | 1918758 A2 | 5/2008 |
| GB | 2075762 A | 11/1981 |
| JP | 56140316 | 11/1981 |

* cited by examiner

ELECTROMAGNETIC ACTUATOR FOR OPTICAL DEVICE TO REDUCE TEMPERATURE AND DEFORMATION

FIELD OF THE INVENTION

The present invention concerns an actuator, in particular, but not exclusively, to an actuator which operates by applying an actuating signal to an actuation coil which cooperates with a support frame to effect oscillation of a support frame, wherein the support frame comprises cut-out regions which reduce stress on the actuation coil as the support frame oscillates and/or which reduce the temperature dependence of the actuator.

DESCRIPTION OF RELATED ART

Typically electromagnetic actuators which are used to oscillate mirrors, such as micro-mirrors, comprise a movable support frame on which the mirror is supported. The movable support frame is configured such that it can oscillate about an oscillation axis. An actuation coil cooperates with the support frame; the actuation coil is arranged such that it is submerged in a magnetic field provided by a magnetic component in the electromagnetic actuator. An actuation signal, which is typically in the form of an alternating current, is provided in actuation coil, which results in a Lorentz force which oscillates the movable support frame about its oscillation axis.

It has been recognised that as the support frame oscillates, warp can be transmitted from an edge of the support frame to the mirror. Warp will cause distortion of mirror which ultimately causes the mirror to inaccurately redirect light, during operation. As solution to the problem of mirror distortion has been posed in EP1255150 wherein it is disclosed to provide boundary portions between the mirror and the support frame; the boundary portions are filled with filler made of a polyamide material different to a material of said oscillating support frame. The boundary portion substantially separates the mirror and support frame and functions to dissipate warp before the warp is transmitted to the mirror. Thus, the influence of warp transmitted from the edge of the support frame to the mirror is reduced, and distortion of the mirror is reduce or eliminated.

However, it has not been recognised in the art, that oscillation of the support frame can also impart stress on the actuation coil. These stresses can cause ware and tare of the actuation coil and will ultimately reduce the lifetime of the actuation coil. Additionally, changes in the properties of the actuator due to a temperature changes, for example due to the laser heating in working condition, or due to a change in the ambient temperature, has not been recognised. These changes in the properties of the actuator will reduce the quality of the actuator.

It is an aim of the present invention to obviate, or mitigate, at least some of the above-mentioned disadvantages.

BRIEF SUMMARY OF THE INVENTION

According to the invention, there is provided an actuator comprising, a movable member, the movable member comprising a support frame which is configured such that it can oscillate about a first oscillation axis and a mirror which is fixed to the support frame such that oscillation of the support frame will effect oscillation of the mirror; a coil, which cooperates with the support frame; one or more boundary portions provided between the support frame and the mirror which reduce the influence of warp transmitted from an edge of the support frame to the mirror, as the support frame oscillates about the first oscillation axis; wherein the support frame further comprises one or more cut-out regions, wherein the one or more cut-out regions are configured to be parallel to at least a portion of the coil, to reduce stress on the coil as the support frame oscillates about the first oscillation axis.

The one or more cut-out regions may be further configured to reduce the temperature dependence of the properties of the actuator. For example, the cut out regions will provide a thermal barrier which will restrict the conduction of heat from the mirror to components such as the coil and/or torsional bars which cooperate with the support frame. Accordingly, the properties of the coil will be less affected by the increase in temperature of the mirror which occurs when the actuator is in use. Also reducing the temperature of the torsional bars will enable improved oscillation of the support frame. The cut-out regions may be filled by material presenting for example some specific thermo mechanical properties wherein the Young modulus of the material may vary with temperature in such a way that the properties of the actuator are independent of temperature changes which occur when the actuator is in use. The cut-out regions may be filled by material presenting for example some specific thermal properties absorbing the heating and thus reducing the heat propagation from the mirror to torsional bars which oscillate the support frame.

"Parallel" means extending in the same direction; the direction of extension is not limited; it includes, but is not limited to, extending in the same straight direction, or extending in the same curved or meandering direction, etc.

"Coil" means any conductive component arranged in any configuration. For example, the coil may be a conducting strip such as a metal strip, copper wire or a doped region. A coil is not limited to having a closed loop configuration.

A "cut-out region" in the support frame is a region of the support frame which is provided with a through-hole, or is a region of the support frame which is provided with grooves. The cut out region may be elliptic, circular or with rounded corners. The grooves may be filled with a filler material which is different to the material from which the support frame is composed. The filler material may be configured to absorb energy which defines the stresses and strains or warp, which are created as the support frame oscillates about the first oscillation axis. For example, the filler material may comprise polyamide or polyimide material which has energy absorbing properties. Moreover the filler material may also be configured to have some heat absorption properties to reduce the temperature dependence of the actuator's performances e.g. to reduce the conduction of heat from the mirror to the coil and/or torsional bars. The filler material may be configured to absorb heating energy, caused due to external heating, so as to reduce the temperature sensitivity of the actuator's properties The coil may be at least one of an actuation coil which can conduct an actuation signal which effect oscillation of the support frame, or a detection coil in which a signal is induced when the support frame oscillates, wherein the induced signal is indicative of the position of the support frame. As the mirror is secured to the support frame the induced signal is also indicative of the position of the mirror.

The actuator may comprise two coils each of which cooperates with the support frame. The actuator may comprise both an actuation coil and a detection coil. Both the actuation coil and a detection coil may be arranged to cooperate with the support frame. Alternatively, the actuation coil may be arranged on the support frame and the detection coil may be arranged on a fixed portion of the actuator.

The actuator may comprise a magnetic field generating means which is configured to provide a magnetic field in the region of the coil. Providing a magnetic field in the region of the coil will ensure that a force on the support frame can be created, which oscillates the support frame about the first oscillation axis. By providing an actuation signal in the actuation coil. For example, if the actuation signal is an alternating current, a Lorentz force is created which oscillates the support frame about the first oscillation axis.

The actuator may be configured to be an electrostatic actuator. The actuator may comprise a comb drive. The actuator may be configured to be an electromagnetic actuator. The actuator may comprise a magnetic field generating means which is configured to provide a magnetic field in the region of the coil, so that providing a actuation signal in the coil will effect a force on the support from which oscillates the support frame about the first oscillation axis. The actuator may be configured to be a thermal actuator. The actuator may be configured to be a piezoelectric actuator.

The one or more cut-out regions may be arranged such that they are located between the coil and an outer edge of the support frame.

The one or more cut-out regions may be arranged such that they are located between the coil and an edge of the support frame.

The one or more cut-out regions may be arranged such that they are located between the coil and an inner edge of the support frame. The one or more cut-out regions may be arranged such that they are located between the coil and an inner edge of the support frame which is connected to the mirror. The inner edge of the support frame may be connected to the mirror by means of connectors.

The one or more cut-out regions may be arranged such that they are located between the coil and an outer edge of the support frame. The outer edge may be perpendicular to the first oscillation axis. The one or more cut-out regions may be arranged such that they are located between the coil and an outer edge of the support frame which is connected to a fixed part of the actuator. The outer edge of the support frame may be connected to the fixed part of the actuator by means of torsional bars. The torsional bars may define the first oscillation axis.

The torsional bars may comprise a meandering configuration. The torsional bars may comprise a serpentine configuration. The torsional bars may comprise a straight configuration.

The actuator may comprise a plurality of cut out regions. The actuator may comprise at least two cut-out regions arranged such that they are located between the coil and an inner edge of the support frame and two cut-out regions arranged such that they are located between the coil and an outer edge of the support frame.

The actuator may comprise one or more cut-out regions which are arranged such that they are located between the coil and an inner edge of the support frame.

The cut-out regions are arranged in the support frame to absorb warp which is transmitted from an edge of the support frame as the support frame oscillates. The cut-out regions are arranged in the support frame to absorb warp which is transmitted from an edge of the support frame as the support frame oscillates, before the warp reaches the coil. In same way the cut-out regions reduce the influence of the temperature on the properties of the actuator by providing some thermal isolation e.g. thermal isolation between the mirror and the coil and/or torsional bars.

The cut-out regions may be through-holes.

The cut-out regions may be grooves. The grooves may further comprise filler material which is configured to absorb stresses in the support frame, caused due to oscillation of the support frame, so as to reduce the amount of stress on the coil as the support frame oscillates about the first oscillation axis. The filler material may be material which is different to the material from which the support frame is composed. The filler material may be configured to absorb warp which is transmitted from an edge of the support frame as the support frame oscillates. The filler material may also be configured to have some thermal properties, such as heat absorption properties, to reduce the temperature sensitivity of the actuator's performances.

The one or more cut regions may be arranged to traverse the first oscillation axis. The one or more cut regions may be arranged to be perpendicular to the first oscillation axis.

At least one of the one or more cut-out regions may have a longitudinal configuration. All of the one or more cut-out regions may have a longitudinal configuration.

The actuator may comprise at least two longitudinal cut-out regions. The electromagnetic actuator may comprise four longitudinal cut-out regions.

The actuator may comprise a first and second pair of cut-out regions. The first pair of cut-out regions may comprise a first and second cut-out region arranged on opposite sides of the coil, and the second pair of cut-out regions may comprise a third and fourth cut-out region arranged on opposite sides of the coil.

The first and second pairs of cut-out regions may be located on opposing portions of the support frame.

The first and second pairs of cut-out regions may be arranged such that the cut-out regions of each pair traverse the oscillation axis of the support frame.

One or more cut-out regions may be n-shaped. One or more cut-out regions may be u-shaped. The actuator may comprise at least two cut-out regions. At least two of the cut-out regions may comprise three longitudinal sections. The three longitudinal sections may be arranged to define an n-shaped or u-shaped cut-out region. At least two of the cut-out regions may comprise a first, second and third longitudinal section, wherein the first and second longitudinal sections are parallel, and a third longitudinal section is perpendicular to the second longitudinal section to define a n-shaped or u-shaped cut-out region.

The actuator may comprise four cut-out regions. Two of the cut-out regions may each comprise three longitudinal sections and two of the cut-out regions each comprise a single longitudinal section. The two cut-out regions which each comprise three longitudinal sections, may each have the three longitudinal sections arranged to define a n-shape cut-out region or u-shaped cut-out region.

The actuator may comprise six cut-out regions. The actuator may comprise a first and second pair of cut-out regions each pair located on opposite portions of the support frame, and the cut-out region of each pair being arranged on opposite sides of the coil; and a third pair of cut-out regions defined by an n-shaped and u-shaped cut out region. Wherein the third pair of cut-out regions are arranged such that they are located between the first and second pair of cut-out regions. The cut-out regions of defining the first and second pair of cut-out regions, each comprise a longitudinal configuration.

The coil may be arranged in a square configuration on the support frame. The one or more cut-out portions may be arranged parallel to at least one of the side of the square. The coil may be arranged in any suitable configuration on the support frame. The one or more cut-out portions may be arranged parallel to at least part of the coil or to the whole of the actuation coil. For example, the coil could also be arranged in a circular configuration or in a meandering configuration and the cut-out portions may be arranged parallel to part of, or the whole of, the coil i.e. the cut-out portions could also be configured to have a circular or meandering configuration.

The actuator may comprise a second support frame. The second support frame may have any of the features described above for the support frame.

The second support frame may be connected to a fixed part of the actuator by means of torsional bars. The torsional bars may define the a second oscillation axis. The torsional bars may comprise a meandering configuration. The torsional bars may comprise a serpentine configuration. The torsional bars may comprise a straight configuration.

The actuator may be configured such that the second support frame can oscillate about the first oscillation axis. The support frame may be fixed to the second support frame such that oscillation of the second support frame will effect oscillation of the support frame about the first oscillation axis. The actuator may be configured to comprise a second support frame which cooperates with the support frame, wherein the second support frame is configured such that it can oscillate about an oscillation axis, and wherein one or more coils are further provided in cooperation with the second support frame. The one or more coils may comprise an actuation coil which can conduct an actuation signal which will effect oscillation of the second support frame. The one or more coils may comprise a detection coil in which a signal is induced when the support frame oscillates, wherein the induced signal is representative of the position of the support frame and thus representative of the position of the mirror.

The second support frame may be configured to oscillate about a second oscillation axis. The second oscillation axis may be orthogonal to the first oscillation axis. The support frame may be arranged to cooperate with the second support frame. The support frame may be arranged to cooperate with the second support frame such that the support frame can move relative to the second support frame. The support frame may be arranged to cooperate with the second support frame such that the support frame can oscillate about the first oscillation axis, relative to the second support frame.

The actuator may be configured such that the oscillation axis about which the second support frame can oscillate, is orthogonal to the first oscillation axis, so that the mirror can be oscillated in two-dimensions.

The second support frame may further comprise one or more cut-out regions. The one or more cut-out regions may have any suitable configuration. In particular, the one or more cut-out regions may be configured as the cut-out regions described-above for the support frame.

The actuator may comprise six cut-out regions. The actuator may comprise two pairs of cut-out regions on the second support frame and a pair of cut-out regions on the support frame. Each cut out regions may have a longitudinal configuration.

The actuator may comprise eight cut-out regions. The actuator may comprise two pairs of cut-out regions on the support frame and two pairs of cut-out regions on the second support frame. Each cut out region in a pair may be arranged on opposite sides of a coil which cooperates with the respective support frame.

One or more coils may be provided on the second support frame. The actuator may comprise an actuation coil which cooperates with the second support frame. The actuator may comprise a detection coil which cooperates with the second support frame. The actuator may comprise both an actuation coil and a detection coil each of which cooperate with the second support frame. These coils may be provided in addition to one or more coils provided on the support frame.

The actuator may comprise a first actuation coil on the support frame. The actuator may comprise a second actuation coil on the second support frame. The actuator may comprise a first detection coil on the support frame. The actuator may comprise a second detection coil on the second support frame.

Actuation coils are coils which conduct an actuation signal which will cause oscillation of a respective support frame; and detection coils are coils which are arranged such that a signal is induced in the detection coil as their respective support frame is oscillated.

The actuator may further comprise one or more spacing regions which are arranged between the support frame and second support frame. The space regions may be configured to reduce the electrical coupling between one or more coils on the support frame and one or more coils on the second support frame. Furthermore, advantageously, the one or more spacing regions will reduce the amount of material required to manufacture the actuator; thus the actuator will have reduced production costs. Moreover, the spacing regions will optimise the dynamic performance of the actuator by reducing the mass of the moveable member.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
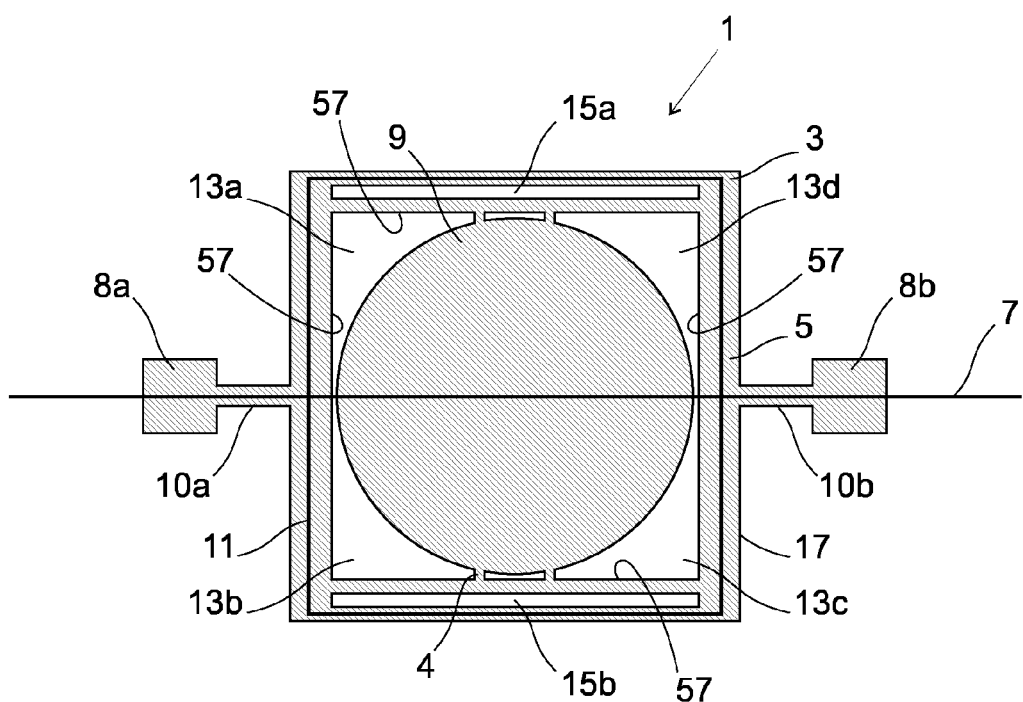
FIG. 1 shows an aerial view of an actuator according to an embodiment of the present invention.

FIG. 1 shows an aerial view of an electromagnetic actuator 1 according to an embodiment of the present invention. The electromagnetic actuator 1 comprises a movable member 3. The movable member 3 comprises a support frame 5 which is configured such that it can oscillate about a first oscillation axis 7 and a mirror 9 which is fixed to the support frame 5 such that oscillation of the support frame 5 will effect oscillation of the mirror 9. The mirror 9 is fixed to the support frame 5 by means of connectors 4. The support frame 5 oscillates by means of torsional bars 10a, 10b which cooperate respectively with fixed portions 8a, 8b of the electromagnetic actuator 1.

The electromagnetic actuator 1 comprises an actuation coil 11, which cooperates with the support frame 5. It will be understood that the support frame 5 could be arranged in any other configuration; for example, the support frame could be arranged in a circular or oval configuration. The actuation coil 11 is arranged in a square configuration on the support frame 5 However, it will be understood that the actuation coil 11 could be arranged in any other configuration on the support frame 5; for example, the actuation coil 11 could be configured to comprise a series of curves or meanders, or could be arranged in a circular or oval configuration on the support frame 5. The actuation coil could also be constituted by two or more superposed coils.

The electromagnetic actuator 1 comprises a magnetic field generating means, in the form of a permanent magnet (not shown). The permanent magnet is arranged to provide a magnetic field in the region of the actuation coil 11, so that providing an actuation signal (e.g. an alternating current) in the actuation coil 11 will affect a Lorentz force on actuation coil 11 which in turn will force the support frame 5 to oscillate about the first oscillation axis 7. The permanent magnet is preferably secured to a fixed portion of the electromagnetic actuator 1 i.e. to a portion of the electromagnetic actuator 1 other than the movable member 3.

The electromagnetic actuator 1 is further provided with boundary portions 13a-d. The boundary portions 13a-d are provided between the support frame 5 and the mirror 9. The boundary portions 13a-d will reduce the influence of warp transmitted from an outer edge 17 of the support frame to the mirror 9, as the support frame 5 oscillates about the first oscillation axis 7. Thus, the mirror 9 will not be distorted by warp when the support frame 5 oscillates about the first oscillation axis 7.

The support frame 5 further comprises one or more cut-out regions 15a, 15b; in this particular example the support frame 5 comprises two cut-out regions 15a, 15b. It will be understood that support frame 5 is not limited to comprising two cut-out regions; the support frame 5 could comprise any number of cut-out regions.

The cut-out regions 15a, 15b are arranged such that they are located between the actuation coil 11 and an inner edge 57 of the support frame 5. The cut-out regions 15a, 15b are configured to be parallel to at least a portion of the actuation coil 11. The cut-out regions 15a, 15b will act to reduce stress on the actuation coil 11 as the support frame 5 oscillates about the first oscillation axis 7. The cut-out regions will act also to reduce the temperature dependence of the actuator's properties; for example the cut-out regions will thermally isolate the mirror from the coil, thus as the mirror heats during operation, heat from the mirror will not affect the properties e.g. electrical conduction properties and mechanical strength properties, of the coil.

Each cut-out region 15a, 15b is a region of the support frame 5 which is provided with a through-hole. However, it will be understood that the cut-out regions are not limited to being through-holes, the cut-out regions 15a, 15b may be a regions of the support frame 5 which are provided with grooves. The grooves may be filled with a filler material which is different to the material from which the support frame 5 is composed; the filler material typically will be configured to absorb stresses and strains, or warp, which are created as the support frame 5 oscillates about the first oscillation axis 7, so as to reduce the stress on the actuation coil 11. The filler material will also be configured to provide a heat sink, which can, for example, absorb the heat coming from the mirror.

Each of the cut-out regions 15a, 15b has a longitudinal configuration. It will be understood that the cut-out regions 15a, 15b are not limited to having a longitudinal configuration, other configurations such as, u-shaped or n-shaped configurations for example, are also possible. The cut-out regions 15a, 15b are arranged to be parallel to the first oscillation axis 7 of the support frame 5.

During use, an actuation signal, such as an alternating current for example, is conducted through the actuation coil 11. The magnetic field generated by the magnetic field generating means, interacts with the actuation coil 11 which is conducting the actuation signal, such that the actuation coil experiences a Lorentz force. As the actuation coil 11 cooperates with the support frame 5, the Lorentz force experienced by the actuation coil 11 causes the support frame 5 to oscillate about the first oscillation axis 7.

As the support frame 5 oscillates about the first oscillation axis 7, stresses in the support frame 5 are created in the region of the support frame 5 where the connectors 4 connect the mirror 9 to the support frame 5. These stresses result in warp which is transmitted from the inner edge 57 of the support frame 5 across the support frame 5, as the support frame 5 oscillates about the first oscillation axis 7. The cut-out regions 15a, 15b prevent the transmission of warp from the inner edge 57 of the support frame 5 to the actuation coil 11. Thus, the cut-out regions 15a, 15b reduce the amount of stress on the actuation coil 11 as the support frame 5 oscillates about the first oscillation axis 7. As the amount of stress on the actuation coil 11 is reduced, the actuation coil suffers less ware and tare and accordingly the lifetime of the actuation coil 11 is increased. The cut-out regions may be filled by material presenting for example some specific thermal properties, e.g. heat absorbing properties, thus reducing the heat propagation from the mirror 9 to the torsional bars 10a and 10b. A low temperature variation around the torsion bars allows the actuator to oscillate in the best condition.

Figure 2:
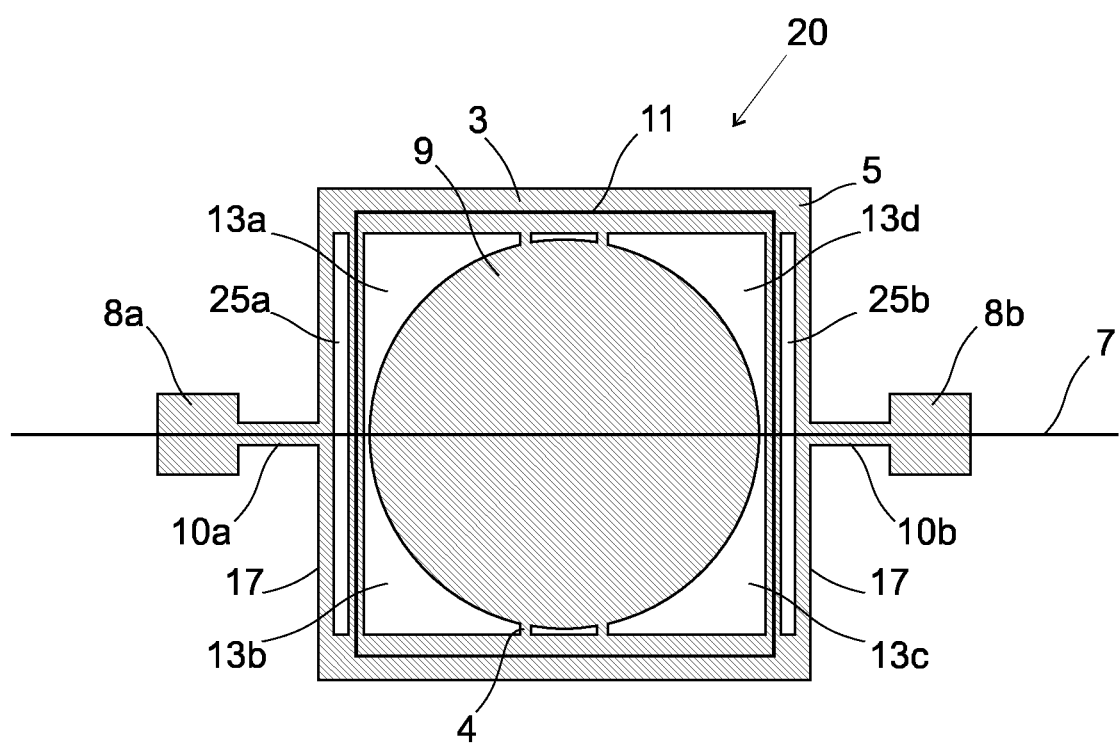
FIG. 2 shows an aerial view of an actuator according to a further embodiment of the present invention.

FIG. 2 shows an aerial view of an electromagnetic actuator 20 according to a further embodiment of the present invention. The electromagnetic actuator 20 has many of the same features as the electromagnetic actuator 1 shown in FIG. 1, and like features are awarded the same reference numbers.

The electromagnetic actuator 20 comprises two cut-out regions 25a, 25b. The cut-out regions 25a, 25b are each arranged such that they are located between the actuation coil 11 and an outer edge 17 of the support frame 5. As for the actuator 1 shown in FIG. 1, the cut-out regions 25a, 25b are configured to be parallel to at least a portion of the actuation coil 11 and will act to reduce stress on the actuation coil 11 as the support frame 5 oscillates about the first oscillation axis 7.

Each of the cut-out regions 25a, 25b are arranged to be perpendicular to the first oscillation axis 7 of the support frame 5. Each of the cut-out regions 25a, 25b is arranged such that they each traverse the first oscillation axis 7 of the support frame 5.

The electromagnetic actuator 20 operates in a similar manner as the electromagnetic actuator 1 shown in FIG. 1. During use, stresses are created in the region of the support frame 5 where the torsional bars 10a, 10b cooperate with the support frame 5. These stresses result in warp which is transmitted from an outer edge 17 of the support frame 5 across the support frame 5, as the support frame 5 oscillates about the first oscillation axis 7. The cut-out regions 15a, 15b prevent the transmission of warp from the outer edge 17 of the support frame 5 to the actuation coil 11. Thus, the cut-out regions 15a, 15b reduce the amount of stress on the actuation coil 11 as the support frame 5 oscillates about the first oscillation axis 7. As the amount of stress on the actuation coil 11 is reduced, the actuation coil suffers less ware and tare and accordingly the lifetime of the actuation coil 11 is increased. The cut-out regions may be filled by material presenting for example some specific thermo mechanical properties wherein the Young modulus may vary with temperature in such a way that the properties of the actuator are independent on the temperature. The cut-out regions may be filled by material presenting for example some specific thermal properties absorbing the heating and thus reducing the heat propagation from the mirror 9 to the torsional bars 10a and 10b.

Figure 3:
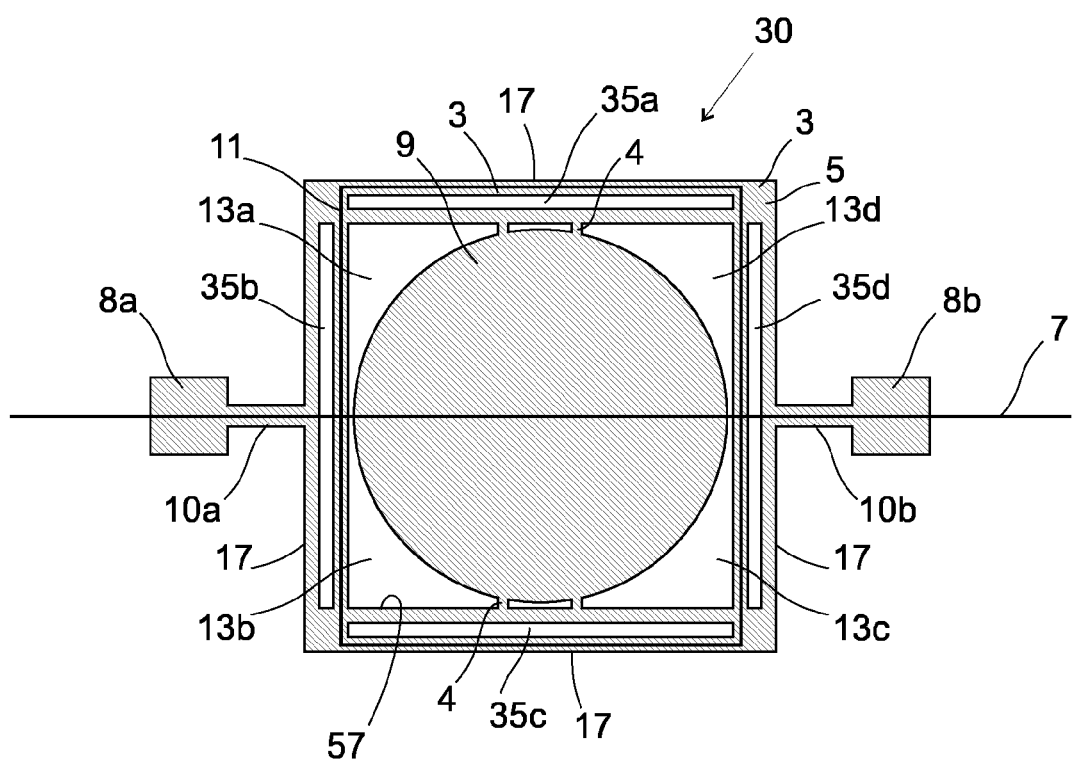
FIG. 3 shows an aerial view of an actuator according to a further embodiment of the present invention.

FIG. 3 shows an aerial view of an electromagnetic actuator 30 according to a further embodiment of the present invention. The electromagnetic actuator 30 has many of the same features as the electromagnetic actuators 1, 20 shown in FIGS. 1 and 2, and like features are awarded the same reference numbers.

The electromagnetic actuator 30 comprises four cut-out regions 35a-d. Each of the cut-out regions 35a-d has a longitudinal configuration. Cut-out regions 35a, 35b are arranged to be perpendicular to the first oscillation axis 7 of the support frame 5, such that each of the cut-out regions 35a, 35b traverse the first oscillation axis 7 of the support frame 5. Cut-out regions 35c, 35d are arranged to be parallel to the first oscillation axis 7 of the support frame 5.

The two cut-out regions 35b, 35d are each arranged such that they are located between the actuation coil 11 and an outer edge 17 of the support frame 5. The cut-out regions 35b, 35d are configured to be parallel to at least a portion of the actuation coil 11. During use, stresses are created in the region of the support frame 5 where the torsional bars 10a, 10b cooperate with the support frame 5. These stresses result in warp which is transmitted from an outer edge 17 of the support frame 5 across the support frame 5, as the support frame 5 oscillates about the first oscillation axis 7. The cut-out regions 35b, 35d prevent the transmission of warp from the outer edge 17 of the support frame 5 to the actuation coil 11. The two cut-out regions 35a, 35c are arranged such that they are located between the actuation coil 11 and an inner edge 57 of the support frame 5. The cut-out regions 35a, 35c are configured to be parallel to at least a portion of the actuation coil 11. During use stresses are created in the region of the support frame 5 where the connectors 4 connect the mirror 9 to the support frame 5. These stresses result in warp which is transmitted from the inner edge 57 of the support frame 5 across the support frame 5, as the support frame 5 oscillates about the first oscillation axis 7. The cut-out regions 35a, 35c prevent the transmission of warp from the inner edge 57 of the support frame 5 to the actuation coil 11. The cut-out regions may be filled by material presenting for example some specific thermo mechanical properties wherein the Young modulus of the material may vary with temperature in such a way that the properties of the actuator are independent on the temperature. The cut-out regions may be filled by material presenting for example some specific thermal properties absorbing the heating and thus reducing the heat propagation from the mirror 9 to the torsional bars 10a and 10b. Thus, the electromagnetic actuator 30 shown in FIG. 3 combines the advantages associated with the electromagnetic actuator 1 shown in FIG. 1 with the advantages associated with the electromagnetic actuator 20 shown in FIG. 2.

The electromagnetic actuator 30 operates in the same manner as the electromagnetic actuator 20 shown in FIG. 2; however, unlike the electromagnetic actuator 20 the electromagnetic actuator 30 comprises four cut-out regions 35a-d (instead of two) which provide for improved reduction in the amount of stress on the actuation coil 11 as the support frame 5 oscillates about the first oscillation axis 7 and/or for improved the reduction of the temperature sensitivity. Having more cut out regions 35a-d, a greater length of the actuation coil 11 is protected against stresses i.e. the transmission of warp from the outer edge 17 of the support frame 5 to a greater length of actuation coil 11, is prevented. In same way, a greater length of the coil is thermally isolated from the mirror; this will further reduce the temperature sensitivity of the actuator.

Figure 4:
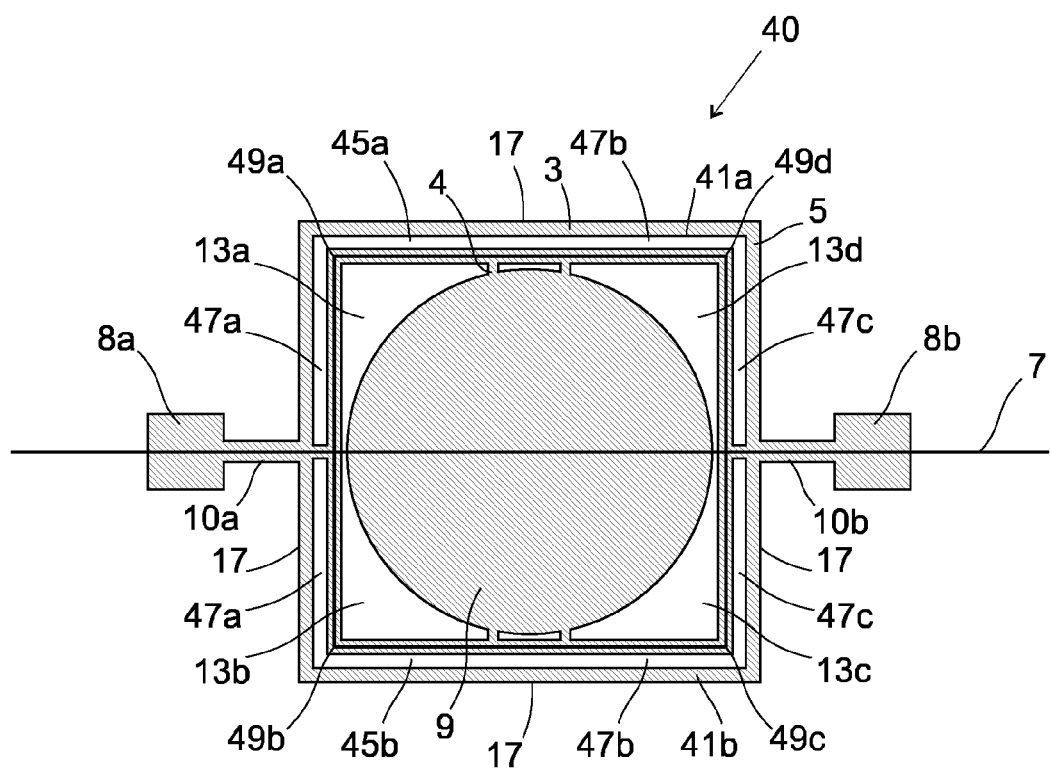
FIG. 4 shows an aerial view of an actuator according to a further embodiment of the present invention.

FIG. 4 shows an aerial view of an electromagnetic actuator 40 according to a further embodiment of the present invention. The electromagnetic actuator 40 has many of the same features as the electromagnetic actuator 20 shown in FIG. 2, and like features are awarded the same reference numbers.

The electromagnetic actuator 40 comprises two cut-out regions 45a, 45b. Each of the cut-out regions 45a, 45b comprises three longitudinal sections 47a-c. In the cut-out region 45a the three longitudinal sections 47a-c are arranged to define an n-shaped cut-out region 45a; in the cut-out regions 45b the three longitudinal sections 47a-c are arranged to define a u-shaped cut-out region 45b. In each of the cut-out regions 45a, 45b the first and second longitudinal sections 47a, 47b are parallel and a third longitudinal section 47c is arranged perpendicular to the first and second longitudinal sections 47a, 47b to define an n-shaped or u-shaped cut-out region 45a, 45b. The cut-out regions 45a, 45b are arranged on opposing portions 41a 41b of the support frame 5.

The cut-out regions 45a, 45b are arranged to be parallel to a portion of the length of the actuation coil 11. Each cut-out region 45a, 45b is arranged such that they are located between the actuation coil 11 and an outer edge 17 of the support frame 5.

The electromagnetic actuator 40 operates in the same manner as the electromagnetic actuator 20 shown in FIG. 2; however, unlike the electromagnetic actuator 20 the electromagnetic actuator 40 comprises an n-shaped cut-out region 45a and a u-shaped cut-out region 45b located between the actuation coil 11 and an outer edge 17 of the support frame 5. These n-shaped and u-shaped cut-out regions 45a, 45b provide for a reduction in the amount of stress reaching corners 49a-d of the actuation coil 11 and thus further reduce the total amount of stress on the actuation coil 11 as the support frame 5 oscillates about the first oscillation axis 7. More specifically, during use, stresses are created in the region of the support frame 5 where the torsional bars 10a, 10b cooperate with the support frame 5. These stresses result in warp which is transmitted from an outer edge 17 of the support frame 5 across the support frame 5, as the support frame 5 oscillates about the first oscillation axis 7. The cut-out regions 45a, 45b prevent the transmission of warp from the outer edge 17 of the support frame 5 to the actuation coil 11 and also to the corners 49a-d of the actuation coil. The cut-out regions may be filled with material presenting for example some specific thermo mechanical properties wherein the Young modulus may vary with temperature in such a way that the properties of the actuator are independent on the temperature. The cut-out regions may be filled by material presenting for example some specific thermal properties absorbing the heating and thus reducing the heat propagation from the mirror 9 to the torsional bars 10a and 10b.

Figure 5:
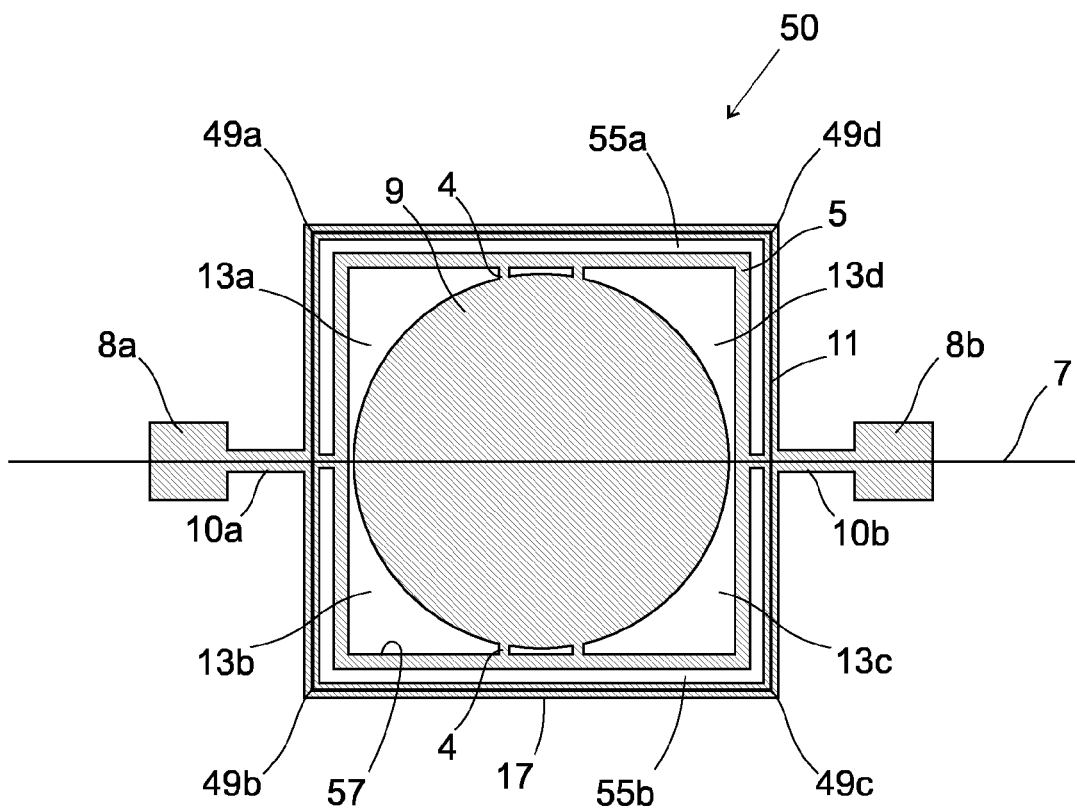
FIG. 5 shows an aerial view of an actuator according to an embodiment of the present invention.

FIG. 5 shows an electromagnetic actuator 50 according to a further embodiment of the present invention. The electromagnetic actuator 50 has many of the same features as the electromagnetic actuator 40 shown in FIG. 1 and like features are awarded the same reference numbers.

The electromagnetic actuator 50 comprises an n-shaped cut-out region 55a and a u-shaped cut-out region 55b similar to the cut-out regions 45a,45b of electromagnetic actuator 40 shown in FIG. 4; however in this particular embodiment the cut-out regions 55a,55b are located between the actuation coil 11 and an inner edge 57 of the support frame 5. These n-shaped and u-shaped cut-out regions 55a, 55b provide for a reduction in the amount of stress reaching corners 49a-d of the actuation coil 11 and thus further reduce the total amount of stress on the actuation coil 11 as the support frame 5 oscillates about the first oscillation axis 7. More specifically, during use, stresses are created in the region of the support frame 5 where the connectors 4 connect the mirror 9 to the support frame 5. These stresses result in warp which is transmitted from an the inner edge 57 of the support frame 5 across the support frame 5, as the support frame 5 oscillates about the first oscillation axis 7. The n-shaped and u-shaped cut-out regions 55a, 55b prevent the transmission of warp from the inner edge 57 of the support frame 5 to the actuation coil 11 and also to the corners 49a-d of the actuation coil. The cut-out regions may be filled by material presenting for example some specific thermo mechanical properties where the Young modulus may vary with temperature in such a way that the properties of the actuator are independent on the temperature. The cut-out regions may be filled by material presenting for example some specific thermal properties absorbing the heating and thus reducing the heat propagation from the mirror 9 to the torsional bars 10a and 10b.

Figure 6:
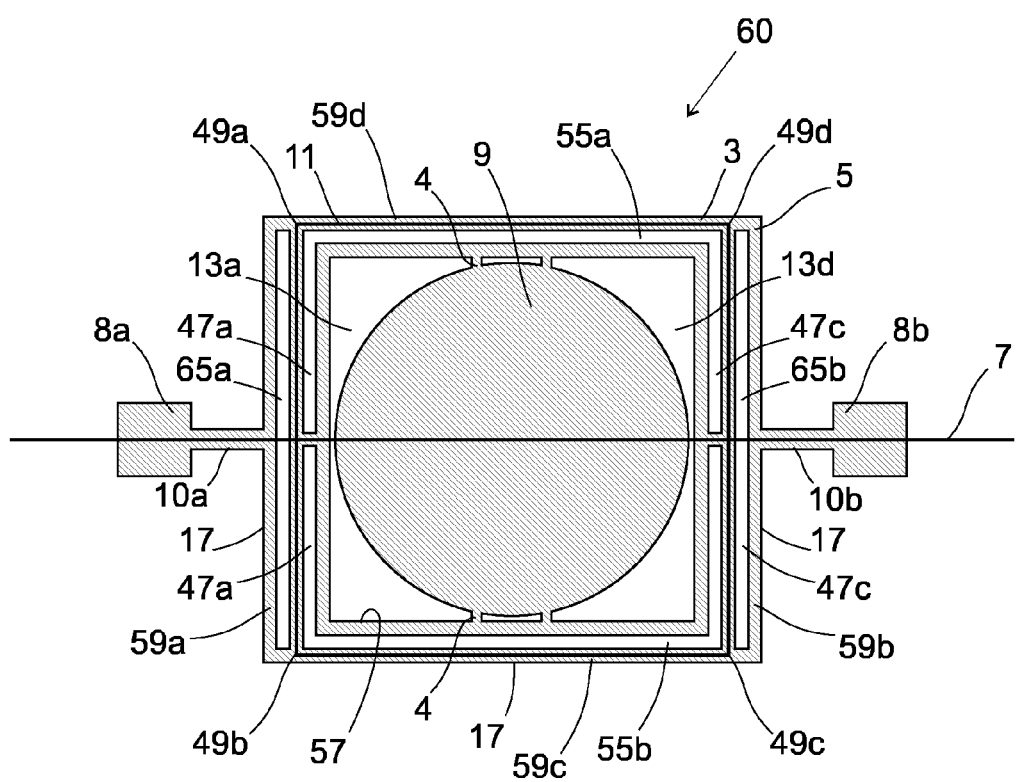
FIG. 6 shows an aerial view of an actuator according to a further embodiment of the present invention.

FIG. 6 shows an aerial view of an electromagnetic actuator 60 according to a further embodiment of the present invention.

The electromagnetic actuator 60 has many of the same features as the electromagnetic actuator 50 shown in FIG. 5, and like features are awarded the same reference numbers.

The electromagnetic actuator 60 further comprises cut-out regions 65a, 65b which are arranged such that they are located between the actuation coil 11 and an outer edge 17 of the support frame 5. The cut-out regions 65a, 65b are arranged parallel to a portion of the actuation coil 11.

The electromagnetic actuator 60 operates in the same manner as the electromagnetic actuator 50 shown in FIG. 5. More specifically, during use, stresses are created in the region of the support frame 5 where the connectors 4 connect the mirror 9 to the support frame 5. These stresses result in warp which is transmitted from the inner edge 57 of the support frame 5 across the support frame 5, as the support frame 5 oscillates about the first oscillation axis 7. The n-shaped and u-shaped cut-out regions 55a, 55b prevent the transmission of warp from the inner edge 57 of the support frame 5 to the actuation coil 11 and also to the corners 49a-d of the actuation coil.

During use, stresses are also created in the region of the support frame 5 where the torsional bars 10a, 10b cooperate with the support frame 5. These stresses result in warp which is transmitted from an outer edge 17 of the support frame 5 across the support frame 5, as the support frame 5 oscillates about the first oscillation axis 7. The cut-out regions 65a, 65b prevent the transmission of warp from the outer edge 17 of the support frame 5 to the actuation coil 11. Thus, the cut-out regions 55a,55b, 65a, 65b cooperate to reduce the amount of stress on the actuation coil 11 as the support frame 5 oscillates about the first oscillation axis 7. The cut-out regions may be filled by material presenting for example some specific thermo mechanical properties wherein the Young modulus may vary with temperature in such a way that the properties of the actuator are independent on the temperature. The cut-out regions may be filled by material presenting for example some specific thermal properties absorbing the heating and thus reducing the heat propagation from the mirror 9 to the torsional bars 10a and 10b.

Figure 7:
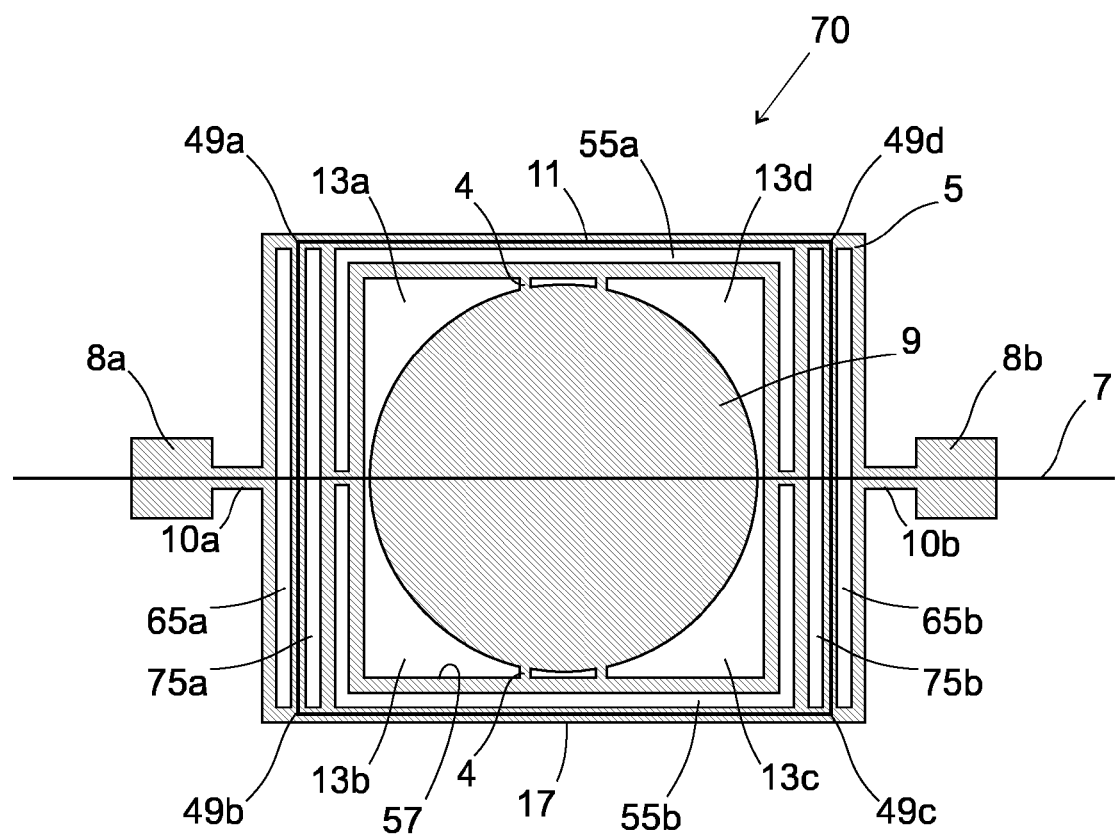
FIG. 7 shows an aerial view of an actuator according to a further embodiment of the present invention.

FIG. 7 shows an aerial view of an electromagnetic actuator 70 according to a further embodiment of the present invention. The electromagnetic actuator 70 comprises many of the same features of the electromagnetic actuator 60 shown in FIG. 6 and like features are awarded the same reference numerals.

The electromagnetic actuator 70 comprises an additional two further longitudinal cut-out regions 75a,75b each of which are located on an opposite side of the actuation coil 11 to cut-out regions 65a and 65b respectively. The cut-out regions 75a,75b further enhance the prevention of the transmission of warp from the inner edge 57 of the support frame 5 to the actuation coil 11, in particular in the region of the support frame 5 where the torsional bars 10a, 10b cooperate with the support frame 5. The cut-out regions may be filled by material presenting for example some specific thermo mechanical properties wherein the Young modulus may vary with temperature in such a way that the properties of the actuator are independent on the temperature. The cut-out regions may be filled by material presenting for example some specific thermal properties absorbing the heating and thus reducing the heat propagation from the mirror 9 to the torsional bars 10a and 10b.

Figure 8:
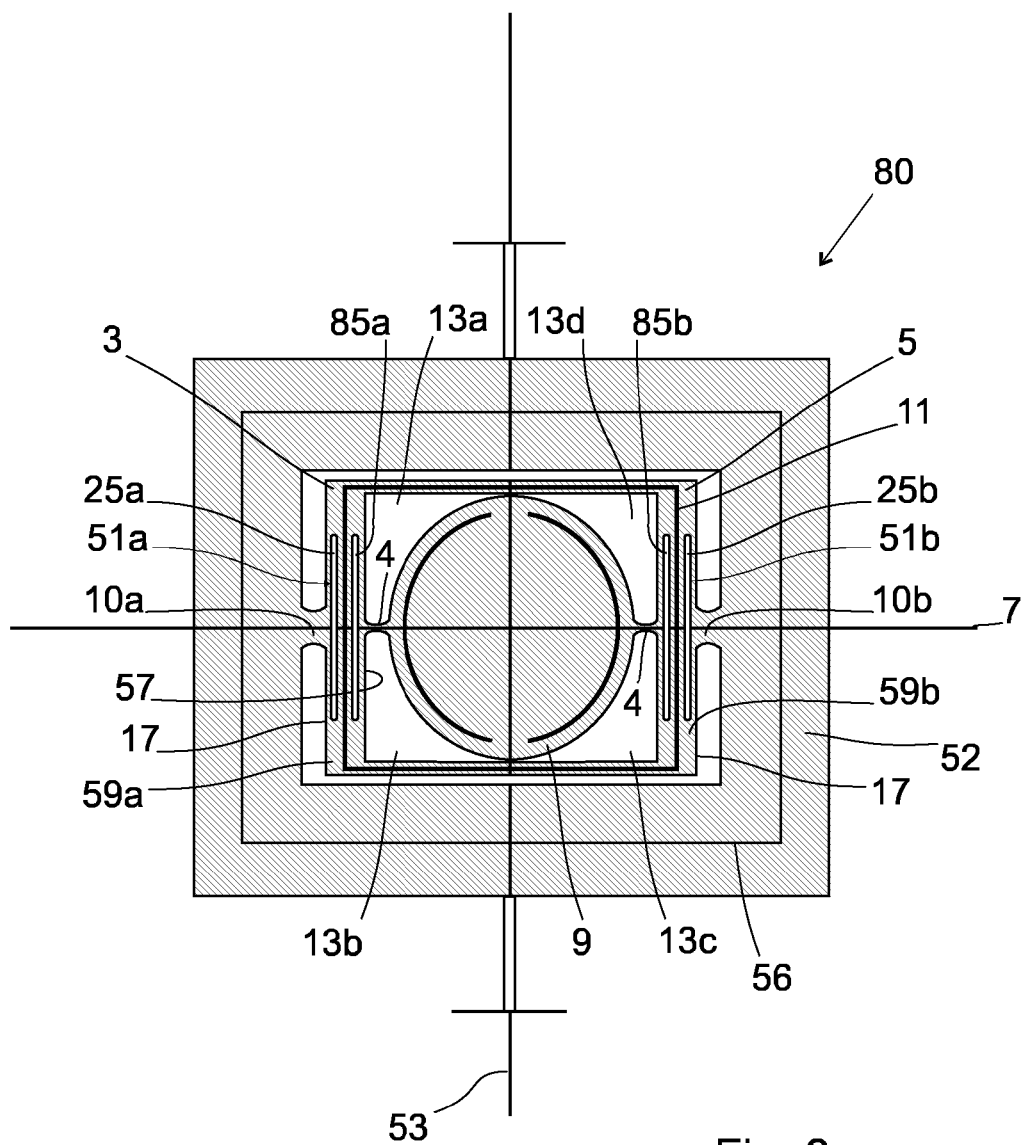
FIG. 8 shows an aerial view of an actuator according to a further embodiment of the present invention.

FIG. 8 shows an aerial view of an electromagnetic actuator 80 according to a further embodiment of the present invention.

The electromagnetic actuator 80 has many of the same features as the electromagnetic actuator 20 shown in FIG. 2, and like features are awarded the same reference numbers.

In FIG. 8 the electromagnetic actuator 80 comprises a second frame 52 which can oscillate along a second oscillation axis 53 which is orthogonal to the first oscillation axis 7.

Torsional bars 10a, 10b are shown to connect the movable member 3 to the second frame 52. The second frame 52 further comprises an induction coil 56; as the support frame 5 oscillates the actuation coil 11 moves within the magnetic field; the movement of the actuation coil relative to the fixed induction coil 56 induces a signal (induction signal) in the induction coil 56. The induced signal can be used to determine the position of support frame 5 and thus ultimately the position of the mirror 9.

The electromagnetic actuator 50 further comprises cut-out regions 85a, 85b which are arranged such that they are located between the actuation coil 11 and an inner edge 57 of the support frame 5.

The cut-out regions 25a and 85a define a first pair 51a of cut-out regions, while the cut-out regions 25b and 85b define a second pair 51b of cut-out regions. The cut-out regions 25a and 85a which define the first pair 51a of cut-out regions are arranged on opposite sides of the actuation coil 11. The cut-out regions 25b and 85b which define the second pair 51b of cut-out regions are arranged on opposite sides of the actuation coil 11. The first and second pairs of cut-out regions 51a, 51b are located on opposing portions 59a, 59b of the support frame 5.

The first and second pairs of cut-out regions 51a, 51b are arranged such that the cut-out regions 25a, 85a, 25b, 85b of each pair 51a, 51b are perpendicular to the first oscillation axis 7 and traverse the first oscillation axis 7 of the support frame 5.

It should also be noted, that in this particular embodiment the connectors 4 which connect the mirror to the support frame, are arranged along the first oscillation axis 7 of the support frame 5.

The electromagnetic actuator 80 operates in the same manner as the electromagnetic actuator 20 shown in FIG. 2, with the second frame 58 further oscillating about the second, orthogonal, oscillation axis 53 so that mirror 9 is oscillated in two dimensions. However, unlike the electromagnetic actuator 20 the electromagnetic actuator 80 further comprises cut-out regions 85a, 85b which are arranged such that they are located between the actuation coil 11 and an inner edge 57 of the support frame 5. During use, stresses are created in the region of the support frame 5 where the connectors 4 connect the mirror 9 to the support frame 5. These stresses result in warp which is transmitted from the inner edge 57 of the support frame 5 across the support frame 5, as the support frame 5 oscillates about the first oscillation axis 7. The cut-out regions 85a, 85b prevent the transmission of warp from the inner edge 57 of the support frame 5 to the actuation coil 11. Thus, the cut-out regions 85a, 85b further reduce the amount of stress on the actuation coil 11. The cut-out regions may be filled by material presenting for example some specific thermo mechanical properties wherein the Young modulus of the material may vary with temperature in such a way that the properties of the actuator are independent on the temperature. The cut-out regions may be filled by material presenting for example some specific thermal properties absorbing the heating and thus reducing the heat propagation from the mirror 9 to the torsional bars 10a and 10b.

Figure 9:
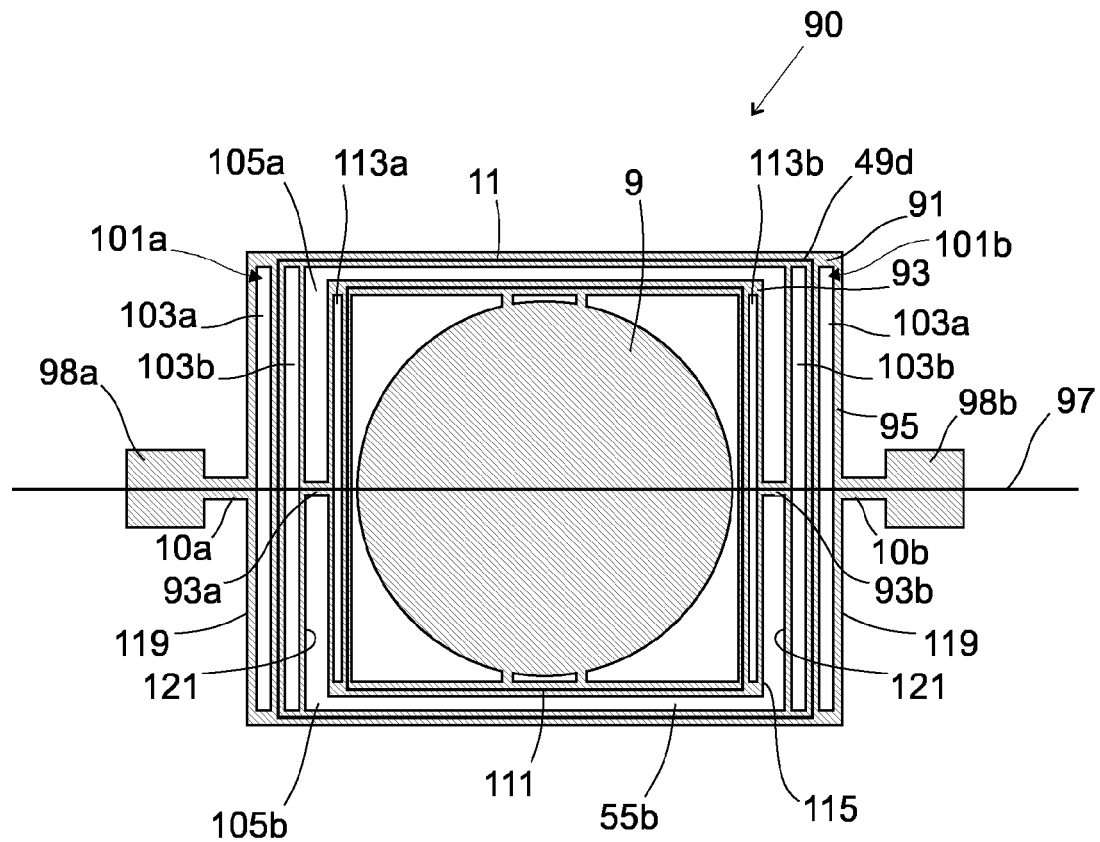
FIG. 9 shows an aerial view of an actuator according to a further embodiment of the present invention.

FIG. 9 provides an aerial view of an electromagnetic actuator 90 according to a further embodiment of the present invention. The electromagnetic actuator 90 comprises many of the same features of the electromagnetic actuator 20 shown in FIG. 2 and like features are awarded the same reference numerals.

The electromagnetic actuator 90 comprises a movable member 95. The movable member 95 is connected to fixed portions 98a, 98b of the electromagnetic actuator 90 by means of torsional bars 10a, 10b; the movable member 95 can oscillate about a first oscillation axis 97 by means of the torsional bars 10a, 10b.

The movable member 95 comprises a first support frame 91 and a second support frame 93; a mirror 9 is secured to the second support frame 93 by means of connectors 4. The second support frame 93 is fixed to the first support frame 91 by means of frame connectors 93a,93b and the second support frame 93 is fixed to the first support frame 91 such that oscillation of the first support frame 91 about the first oscillation axis 97 by means of the torsional bars 10a,10b, will effect oscillation of the second support frame 93 and the mirror 9 about the first oscillation axis 97.

The electromagnetic actuator 90 comprises an actuation coil 11, which cooperates with the first support frame 91. It will be understood that the first support frame 91 could be arranged in any other configuration; for example, the support frame 91 could be arranged in a circular or oval configuration. The actuation coil 11 is arranged in a square configuration on the first support frame 91. However, it will be understood that the actuation coil 11 could be arranged in any other configuration on the first support frame 91; for example, the actuation coil 11 could be configured to comprise a series of curves or meanders, or could be arranged in a circular or oval configuration on the first support frame 91. The actuation coil 11 could also be constituted by two or more superposed coils.

The first support frame 91 further comprises two pairs of longitudinal cut-out regions 101a,101b, each of which comprise a first and second cut-out region 103a,103b arranged on opposing sides of the actuation coil 11. The two pairs of cut out regions 101a,101b are arranged on opposite portions 105a,105b of the first support frame 91.

The electromagnetic actuator 90 comprises a detection coil 111, which cooperates with the second support frame 93. The second support frame 93 further comprises cut-out regions 113a, 113b which are each arranged between the detection coil 111 and an outer edge 115 of the second support frame 93.

The moveable member further comprises two spacer regions 105a,105b which are arranged between the first support frame 91 and the second support frame 93.

During use an actuation signal (e.g. an alternating current) is provided in the actuation coil 11 which is submersed in the magnetic field of the permanent magnet (not shown). The actuation signal will generate a Lorentz force which causes the moveable member 95 to oscillate about the first oscillation axis 97.

As the movable member 95 oscillates about the first oscillation axis 97, the detection coil 111 is moved within the magnetic field provided by the permanent magnet (not shown). A signal (e.g. current signal) will be induced in the detection coil 111 as the detection coil 111 moves within the magnetic field. The instantaneous amplitude of signal induced in the detection coil 111 will be representative of the position of the moveable member 95; thus the instantaneous angular position of the mirror 9 can be determined by measuring the instantaneous amplitude of the signal induced in the detection coil 111.

As described above for the other embodiments, the two pairs of cut out regions 101a,101b will reduce the amount of stress on the actuation coil 11 as the moveable member 95 oscillates about the first oscillation axis 97. More specifically, the cut out regions 103a will prevent, in particular in the region of the first support frame 91 to which the torsional bars 10a, 10b are connected, the transmission of warp from an outer edge 119 of the first support frame 91 to the actuation coil 11. The cut out regions 103b will prevent, in particular in the region of the first support frame 91 to which the frame connectors 93a,93b are connected, the transmission of warp from an inner edge 121 of the first support frame 91 to the actuation coil 11.

The cut-out regions 113a, 113b provided in the second support frame 93, will prevent, in particular in the region of the second support frame 93 to which the frame connectors 93a,93b are connected, the transmission of warp from an outer edge 115 of the second support frame 91 to the detection coil 111, as the moveable member oscillates about the first oscillation axis 97. The cut-out regions may be filled by material presenting for example some specific thermo mechanical properties wherein the Young modulus of the material may vary with temperature in such a way that the properties of the actuator are independent of temperature changes which occur when the actuator is in use. The cut-out regions may be filled by material presenting for example some specific thermal properties absorbing the heating and thus reducing the heat propagation from the mirror 9 to the torsional bars 10a and 10b.

The two spacer regions 105a,105b which are arranged between the first support frame 91 and the second support frame 93 reduce the electrical coupling between the actuation coil 11 and the detection coil 111. Furthermore, the spacer regions 105a, 105b reduce the amount of material required to manufacture the electromagnetic actuator 90; thus the electromagnetic actuator 90 has a reduced production cost. Moreover the spacer regions 105a,105b ensure that the moveable member 95 has reduced mass; the reduced mass of the moveable member 95 will optimise the dynamic performance of the electromagnetic actuator 90.

The spacer regions are regions which are provided with a through-hole. However the spacer regions may be a region which is provided with grooves. The grooves may be filled with a filler material which is different to the material from which the support frame is composed. The filler material may be configured to have some mechanical properties and/or thermal properties. For example, the filler material may be a material which has a frequency-dependent Young's modulus. In another example, the filler material may be configured to have temperature-dependent Young's modulus in such a way that the properties of the actuator are independent on the temperature. In another example, the spacer regions may be filled by material presenting some specific thermal properties absorbing the heating and thus reducing the heat propagation from the mirror 9 to the torsional bars 10a and 10b.

Figure 10:
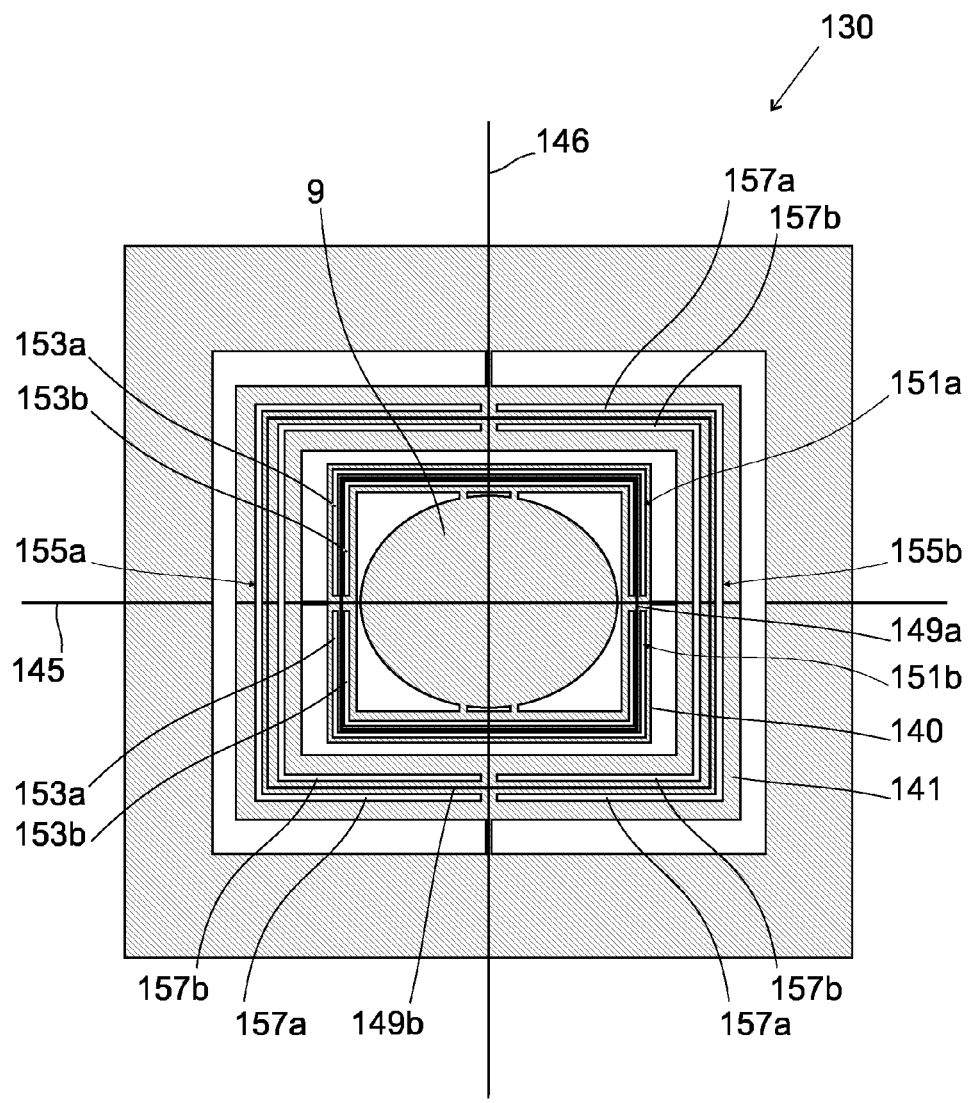
FIG. 10 shows an aerial view of an actuator according to a further embodiment of the present invention.

FIG. 10 shows a magnetic actuator 130 according to a further embodiment of the present invention. The magnetic actuator 130 has many of the same features of the magnetic actuators shown in FIGS. 1-9 and like features are awarded the same reference numbers.

Unlike the other magnetic actuators the magnetic actuator 130 is a 2-D actuator i.e. the mirror 9 is oscillated along two orthogonal oscillation axis 145, 146. The magnetic actuator 130 comprises a first support frame 140 which can oscillate about a first oscillation axis 145 and a second support frame 141 which can oscillate about a second oscillation axis 146. The magnetic actuator 130 comprises a first and second actuation coils 149a, 149b. The first actuation coil 149a cooperates with the first support frame 140 and the second actuation coil 149b cooperates with the second support frame 141.

The first support frame 140 comprise first and second pair of cut out regions 151a, 151b; the cut out regions 153a,b defining each pair 151a, 151b are arranged on opposite sides of the first actuation coil 149a. The second support frame 141 comprises a third and further pair of cut out regions 155a,155b; the cut out regions 157a,b defining each pair 155a, 155b are arranged on opposite sides of the second actuation coil 149b.

During use an actuation signal is provided in the first actuation coil 149a which is submersed in a magnetic field provided by a permanent magnet (not shown). A Lorentz force is created which oscillates the first support frame 140 about the first oscillation axis 145. An actuation signal is provided in the second actuation coil 149b which is submersed in a magnetic field provided by the permanent magnet (not shown). A Lorentz force is created which oscillates the second support frame 141 about the second oscillation axis 146. As a result the mirror 9 is simultaneously oscillated about the first and second oscillation axis 145,146.

As the first and second support frames 140,141 oscillate, stresses are created, in a similar manner to that described for the previous embodiments. The pairs of cut out regions 151a,151b,155a,155b provided in each of the first and second support frames 140,141 prevent the transmission of warp to their respective actuation coils 149a, 149b, as described for the previous embodiments, thus reducing the stress on the first and second actuations coils 149a, 149b. The cut-out regions may be filled by material presenting for example some specific thermo mechanical properties where the Young modulus may vary with temperature in such a way that the properties of the actuator are independent on the temperature. The cut-out regions may be filled by material presenting for example some specific thermal properties absorbing the heating and thus reducing the heat propagation from the mirror 9 to the torsional bars 10a and 10b.

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

Although the present invention was described with reference to a plurality of distinct embodiments, it will be understood that the features described in any one of the embodiments could be incorporated into any of the other embodiments.

It will be understood that the cut out regions are not limited to through holes. Cut-out regions could also be a region of the support frame which has grooves. The grooves may be filled with a filler material which is different to the material from which the support frame is composed. The filler material may be configured to absorb stresses and strains which are created as the support frame oscillates about the first oscillation axis. Moreover the filler material may also be configured to have some thermal properties to reduce the temperature sensitivity of the actuator's performances. The one or more cut-out regions could take any suitable shape; the cut-out regions are not limited to being longitudinal and or u-shaped or n-shaped; for example the one or more cut-out regions could be curved, circular or semi-circular.

Although the above embodiments describe magnetic actuators, it should be understood that the present invention is not limited to magnetic actuators, and that the actuator could take any other suitable form. For example, the actuators could each be an electrostatic actuator, thermal actuator, piezo actuator etc. In each of these cases a coil is required on the movable member of the actuator e.g for detection of the position of the moveable member; thus such actuators could benefit from the cut-out regions to reduce stress on the coil.

It will also be understood that the present invention could be applied to any MEMS mirror device; e.g. a 1D MEMS mirror device wherein the mirror is oscillated about a single oscillation axis, or a 2D MEMS mirror wherein the mirror is oscillated about two oscillation axes e.g two orthogonal oscillation axes.

In the above-described embodiments, it will be understood that the magnetic field generating means may take any suitable form. The magnetic field generating means is not limited to permanent magnet; for example, the magnetic generating means could be electromagnet.

The boundary portions are not limited to being through holes. The boundary portions could be grooves; the grooves may be filled with material which is different to the material from which the support frame is composed. The material may be configured to absorb warp which is transmitted from an edge of the support frame as the support frame oscillates. The filler material may also be configured to have some thermal properties to reduce the temperature sensitivity of the actuator's performances.

The invention claimed is:

1. An actuator comprising:
  a fixed support; and
  a movable member, the movable member mechanically coupled to the fixed support via at least two torsion bars, the movable member comprising:
    a support frame configured to oscillate about a first oscillation axis, the support frame comprising:
      a first set of cut-out portions provided on the support frame; and
      a mirror fixed to the support frame, the oscillation of the support frame to effect an oscillation of the mirror;
    a coil disposed between the first set of cut-out portions on the support frame and an edge of the support frame, at least a portion of the coil to be parallel to the first set of cut-out portions to reduce stress on the coil as the support frame oscillates about the first oscillation axis, the coil to conduct current to apply a Lorentz force to the support frame to oscillate the support frame about the first oscillation axis;
    a magnetic actuator to generate a magnetic field, the magnetic field to encompass at least part of the coil; and
    one or more boundary portions, each of the one or more boundary portions defined by second cut-out portions provided between the first set of cut-out portions on the support frame and the mirror to reduce an influence of warp transmitted from an edge of the support frame to the mirror as the support frame oscillates about the first oscillation axis.

2. An actuator according to claim 1, wherein the first set of cut-out portions are arranged such that they are located between the coil and an inner edge of the support frame.

3. An actuator according to claim 1, wherein the first set of cut-out portions are arranged such that they are located between the coil and an outer edge of the support frame.

4. An actuator according to claim 1, wherein at least one of the first set of cut-out portions or the second cut-out portions are through-holes.

5. An actuator according to claim 1, wherein at least one of the first set of cut-out portions or the second cut-out portions are grooves.

6. An actuator according to claim 5, wherein the grooves further comprise filler material to absorb energy related to stresses in the support frame due to oscillation of the support frame to reduce the stresses on the coil as the support frame oscillates about the first oscillation axis.

7. An actuator according to claim 5, wherein the grooves further comprise filler material to absorb heating energy to reduce a temperature sensitivity of the actuator.

8. An actuator according to claim 1, wherein the first set of cut portions are arranged perpendicular to the first oscillation axis.

9. An actuator according to claim 1, the first set of cut-out portions comprises a first and a second pair of cut-out regions, the first pair of cut-out regions comprising a first and a second cut-out region arranged on opposite sides of the coil, and the second pair of cut-out regions comprising a third and a fourth cut-out region arranged on opposite sides of the coil.

10. An actuator according to claim 1, the support frame a first support frame, the coil a first coil, the actuator comprising:
  a second support frame operably coupled to the first support frame, the second support frame to oscillate about a second oscillation axis; and
  a second coil to conduct current to oscillate the second support frame about the second oscillation axis.

11. An actuator according to claim 10, comprising one or more spacing regions arranged between the first support frame and the second support frame to reduce an electrical coupling between the first coil and the second coil.

12. An actuator according to claim 10, the second support frame comprising a second set of cut-out regions disposed parallel to at least a portion of the second coil to reduce stress on the second coil as the second support frame oscillates about the second oscillation axis.

13. An actuator according to claim 12, the second set of cut-out regions are further configured to reduce a temperature dependence of the actuator.

* * * * *